United States Patent [19]
McCarroll et al.

[11] Patent Number: 5,977,894
[45] Date of Patent: Nov. 2, 1999

[54] DIGITAL CALIBRATION FOR ANALOG-TO-DIGITAL CONVERTERS WITH IMPLICIT GAIN PRORATION

[75] Inventors: Benjamin J. McCarroll, Portland, Oreg.; Chowdhury Rahim, Saratoga, Calif.

[73] Assignee: Maxim Integrated Products, Inc., Sunnyvale, Calif.

[21] Appl. No.: 09/001,340

[22] Filed: Dec. 31, 1997

[51] Int. Cl.⁶ .................................................. H03M 1/06
[52] U.S. Cl. ............................................ 341/120; 341/161
[58] Field of Search ................................. 341/120, 118, 341/161, 155, 162

[56] References Cited

U.S. PATENT DOCUMENTS

| | | | |
|---|---|---|---|
| 5,635,937 | 6/1997 | Lim et al. | 341/161 |
| 5,870,041 | 2/1999 | Lee et al. | 341/118 |

OTHER PUBLICATIONS

"A 10-b 15-MHz CMOS Recycling Two-Step A/D Converter", Bang–Sup Song et al., *IEEE Journal of Solid–State Circuits,* vol. 25, No. 6 (Dec. 1990).

"Digital–Domain Calibration of Multistep Analog–to–Digital Converters", Seung–Hoon Lee et al., *IEEE Journal of Solid–State Circuits,* vol. 27, No. 12 (Dec. 1992).

"Interstage Gain Proration Technique for Digital–Domain Multi–Step ADC Calibration", Seung–Hoon Lee et al., *IEEE Transactions on Circuits and Systems,* vol. 41, No. 1 (Jan. 1994).

Eric G. Soenen et al., "An Architecture and An Algorithm for Fully Digital Correction of Monolithic Pipelined ADC's", IEEE Trans. on Circuits and Systems, Mar. 1995, vol. 42, No. 3.

*Primary Examiner*—Brian Young
*Attorney, Agent, or Firm*—Blakely, Sokoloff, Taylor & Zafman LLP

[57] ABSTRACT

A method of digital calibration for analog-to-digital converters providing implicit gain proration. In accordance with the method, the calibration begins at the center of the transfer curve rather from one end or the other. By beginning in the center, calibrating in the positive direction and then calibrating in the negative direction, the interstage gain errors are also corrected without an extra gain-proration cycle. In addition, the number of accumulated measurements is reduced by a factor of two for the final correction coefficient by using the preferred method. Therefore, the roundoff errors are also reduced.

8 Claims, 6 Drawing Sheets

Pipelined, n-Bit ADC
1st Stage Has Non-Linearity And Gain Errors In The MDAC

Transfer Curve For An Uncalibrated,
6-Bit, 2-Stage ADC With Gain Error

Figure 1

Transfer Curve For A Calibrated,
6-Bit, 2-Stage ADC With Gain Error

Figure 2

Pipelined, n-Bit ADC
1st Stage Has Non-Linearity And Gain Errors In The MDAC

Figure 3

Gain Error vs. Input Voltage

Figure 4

Simplified Thermometer MDAC

Figure 5

Linearity Errors In An MDAC

Figure 6

Simplified MDAC For Code Error
Coefficient Generation

Figure 7

DIGITAL CALIBRATION FOR ANALOG-TO-DIGITAL CONVERTERS WITH IMPLICIT GAIN PRORATION

BACKGROUND OF THE INVENTION

1. Field of the Invention

The present invention relates to the field of high resolution analog-to-digital converters.

2. Prior Art

High-resolution Analog-to-Digital Converters (ADC's) often require some form of calibration to overcome the component mismatches inherent in the circuitry. A digital calibration technique has been published by Prof. Bang-Sup Song which is applicable to pipelined analog-to-digital converters ("Interstage Gain Proration Technique for Digital-Domain Multi-Step ADC Calibration", Lee et al., IEEE Transactions on Circuits and Systems II: Analog and Digital Signal Processing, Vol. 41, No. 1, January 1994). It corrects for component mismatch as well as interstage gain errors (gain proration). According to the article by Bang-Sup Song, "a gain-error proration method is proposed, which distributes the full scale error of the latter stages evenly over the range so that the signal conversion range of the latter stages may match that of the former stages, thereby simplifying multiple-stage digital calibration and extending it to the general multi-step/pipelined architecture." Bang-Sup Song performs a capacitor non-linearity calibration first and then, if the calibrated stage is not the first stage, he performs gain proration. In this case, he does the gain proration twice. However, when the previous stage is then calibrated by the now calibrated subsequent stage(s), the calibration algorithm adjusts the gain of the previous stage so that the interstage gain error is corrected. If there were no roundoff errors, the explicit gain proration will not degrade performance. With roundoff errors, it is believed that the explicit gain proration will degrade performance.

The present invention recognizes that this "gain proration" is not necessary as part of the calibration, but rather that it can be "built in" to the device mismatch corrections. On average, it is believed that in comparison, the gain-proration will degrade the performance of the calibrated analog-to-digital converter and increase the calibration time.

BRIEF SUMMARY OF THE INVENTION

A method of digital calibration for analog-to-digital converters providing implicit gain proration. In accordance with the method, the calibration begins at the center of the transfer curve rather from one end or the other. By beginning in the center, calibrating in the positive direction and then calibrating in the negative direction, the interstage gain errors are also corrected without an extra gain-proration cycle. In addition, the number of accumulated measurements is reduced by a factor of two for the final correction coefficient by using the preferred method. Therefore, the roundoff errors are also reduced.

The method of the invention improves upon the prior art in the following ways:

1. The explicit gain proration required by the prior art can be performed implicitly if the proper starting point is chosen and, in some architectures, if symmetry in the digital-to-analog converter transfer curve is utilized.
2. The time required for implicit-gain-proration calibration is less than that for explicit-gain-proration calibration.
3. The integrated circuit die area is reduced using the proposed method because the hardware required to perform the gain proration is omitted.
4. By picking the correct starting point, the roundoff errors in the correction coefficients are improved in comparison to the prior art method because the maximum number of accumulated measurements to generate the final correction coefficient is reduced by a factor of two.

DETAILED DESCRIPTION OF THE INVENTION

Figure 3:
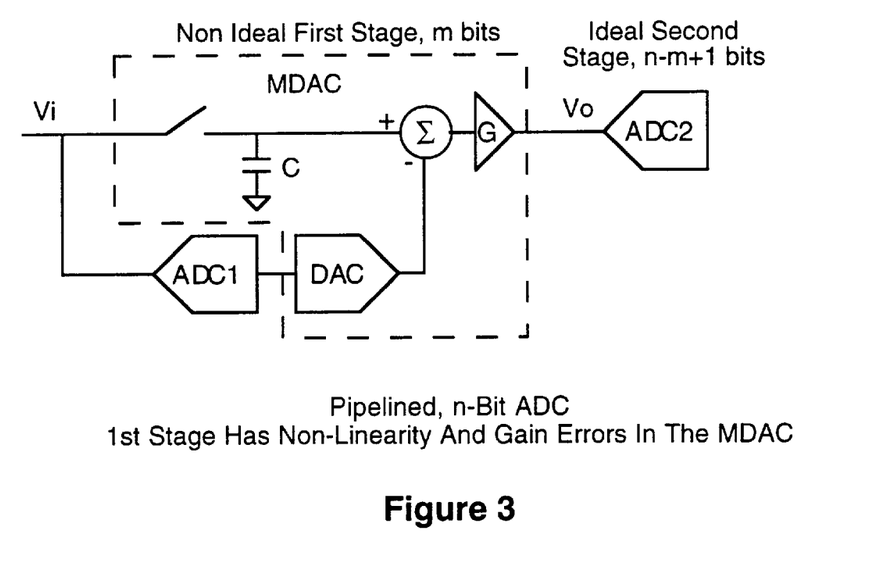
FIG. 3 is a block diagram for a pipelined, n-bit, two stage analog-to-digital converter.

First consider a two-stage, pipelined, analog-to-digital converter of the general type shown in FIG. 3. In this type of converter, the input signal Vi is sampled by switch S and temporally held in capacitor C. The input signal Vi is also converted to digital form by analog-to-digital converter ADC1 (the coarse stage) to provide the most significant bits of the overall conversion. These most significant bits are also converted back to analog form by digital-to-analog converter DAC and subtracted from the sampled input signal by the subtractor $\Sigma$. Since the output of ADC1 would have advanced one or more steps if the output of the subtractor exceeded the analog equivalent of the least significant of the group of most significant (coarse stage output) bits, the output of the subtractor will range from zero to some fraction of the least significant one of the most significant bits. That voltage is then amplified by fixed gain amplifier G and converted to digital form by analog-to-digital converter ADC2 to provide the least significant bits of the overall analog-to-digital converter.

Figure 1:
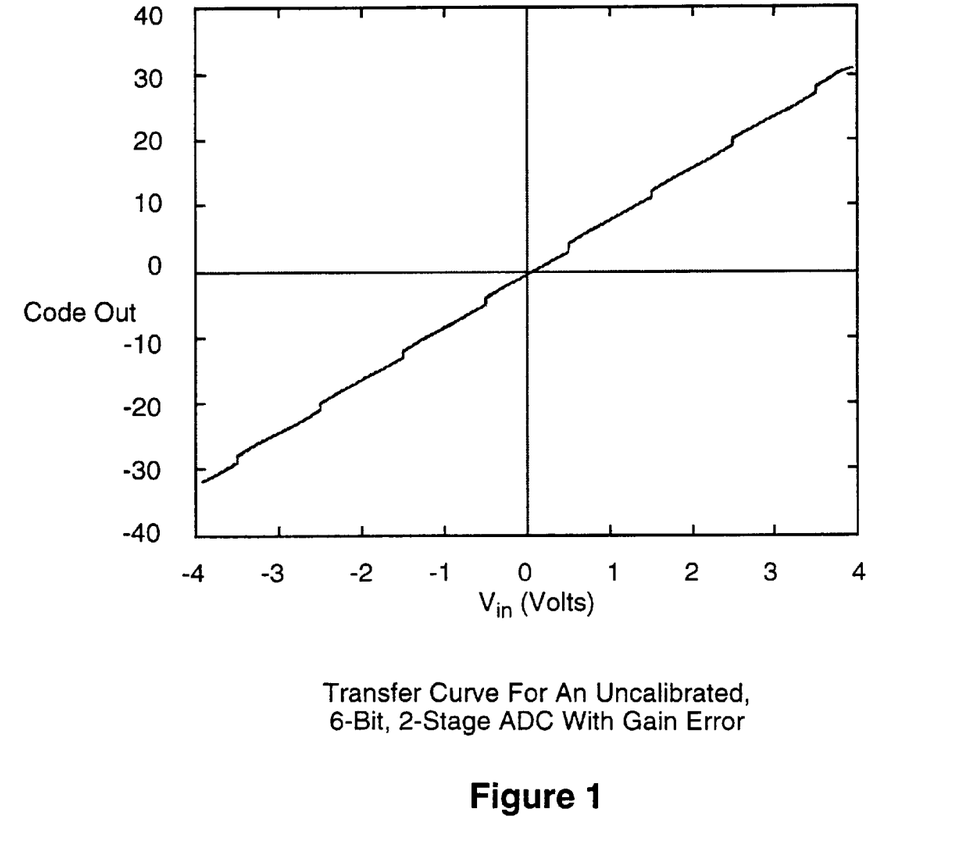
FIG. 1 presents a typical transfer curve for an uncalibrated, 6-Bit, 2-Stage analog-to-digital converter with gain error.

FIG. 1 shows the transfer curve for an exemplary two-stage, 6-bit analog-to-digital converter of the foregoing type wherein the first stage (ADC1 of FIG. 3) is 3 bits and the second stage (ADC1 of FIG. 3) is 4 bits, with one bit of redundancy for error correction. For analysis purposes, the analog-to-digital converters and the digital-to-analog converter are first assumed to be perfect, but the amplifier G is assumed to have a lower than desired DC gain, resulting in an inter-stage gain which is too low to achieve 6-bit performance without some sort of calibration. The gain error is zero whenever the least significant bits from the second stage are all zero, and increases to a maximum just before the first stage transitions where the slope of the transfer curve changes. Because of the low gain illustrated, the first stage transitions before the least significant bits reach all ones. Thus there are missing codes, resulting in a DNL (digital nonlinearity) error of −1.0.

Figure 2:
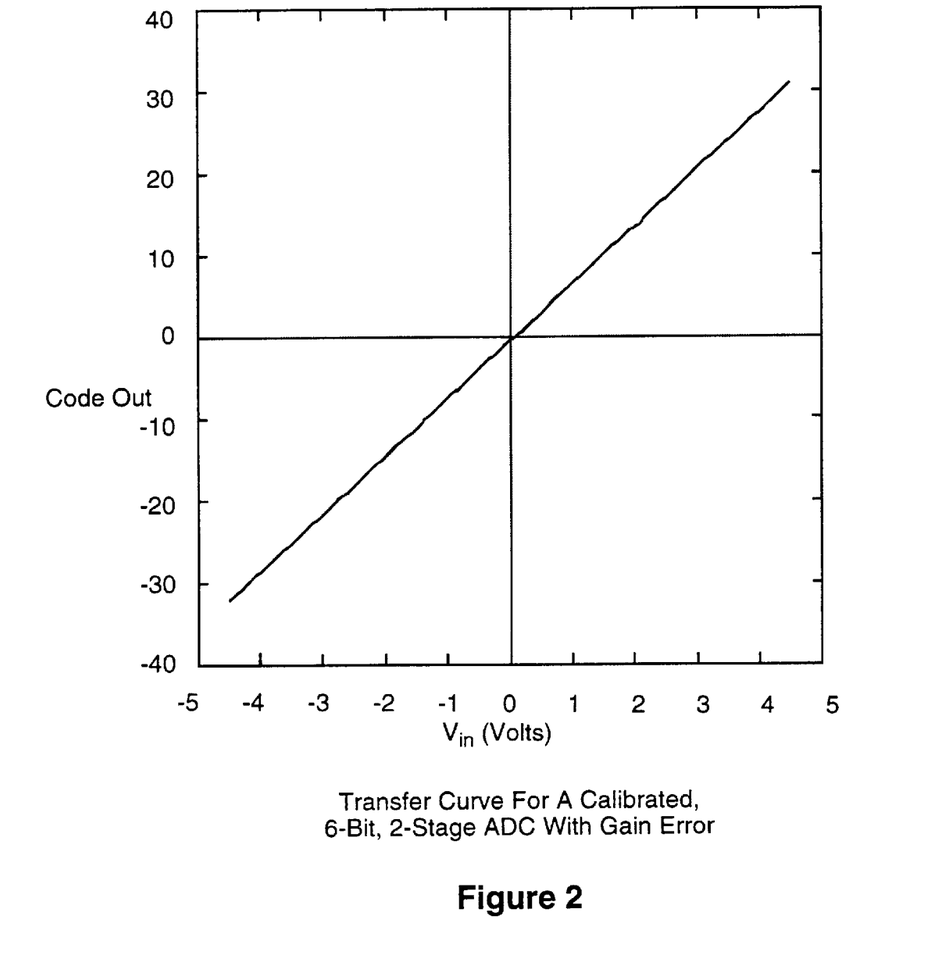
FIG. 2 presents the transfer curve for the 6-bit, 2-stage analog-to-digital converter with gain error of FIG. 1 after calibration.

In the preferred embodiment of the present invention, flash analog-to-digital converters are used, with a binary-weighted capacitor array multiplying digital-to-analog converter (MDAC). In a specific embodiment, the first 3-bit MDAC/FLASH has 9 states. If the correction coefficients shown in Table 1 are subtracted for their respective first stage code, the transfer curve shown in FIG. 2 results. For the specific example shown, if the first stage outputs a code of −2, then 2 LSB is subtracted from the output code. Now, the worst-case DNL is 0.075 LSB. Note that the full-scale range of the input voltage is extended over that of FIG. 1, and that the calibrated gain is different from the uncalibrated gain.

TABLE 1

First-Stage Correction Coefficients.

| First Stage Code | Correction Coefficient |
|---|---|
| −4 | 4 |
| −3 | 3 |
| −2 | 2 |
| −1 | 1 |
| 0 | 0 |
| 1 | −1 |
| 2 | −2 |
| 3 | −3 |
| 4 | −4 |

This correction for gain error was achieved without applying "gain proration". What is important is that the calibration begin at the center of the transfer curve (at 0) and proceed in either direction. The other half of the correction coefficients can either be obtained via odd symmetry or by running the calibration again in the other direction.

FIG. 3 specifically shows a two-stage, pipelined, analog-to-digital converter with an overall resolution of n bits, a resolution of m bits in the first stage, and a resolution of n−m+1 bits in the presumed ideal second stage, with one bit of error correction. The first stage is assumed to have both gain and DAC non-linearity errors. The second ideal stage measures these errors and generates correction coefficients which, in the normal conversion mode, are addressed depending on the state of the first stage, and are digitally added to correct for the first-stage errors. In practice, the ideal stage is comprised of one or more pipelined stages.

For simplicity, it is assumed that the input and output voltages, Vi and Vo, are normalized such that they are always between 0 and 1. In order to represent the quantization process, the syntax $\lfloor x \rfloor$ has been introduced to indicate the nearest integer less than or equal to x.

The interstage voltage is given by $$V_o = (G_1 + \Delta G_1) \cdot \{V_i - [Vdac_1(D_m(V_i)) + \Delta Vdac_1(D_m(V_i))]\}$$

where $G_1 = 2^{m-1}$ = gain of the amplifier
$\Delta G_1$ = the error in the gain $G_1$
$D_m(V_i) = \lfloor 2^m \cdot V_i \rfloor$ = ADC1 output
and the $\Delta$ terms are the gain and DAC errors.
This can be rewritten as

| | |
|---|---|
| $V_O = 2^{m-1} \cdot [V_i - Vdac_1(D_m(V_i))]$ | "Ideal Term" |
| $-G_1 \cdot \Delta Vdac_1(D_m(V_i))$ | "DAC Non-linearity" |
| $+\Delta G_1 \cdot \{V_i - ]Vdac_1(D_m(V_i))\}$ | "Gain Error" |
| $-\Delta G_1 \cdot \Delta Vdac_1(D_m(V_i))$ | "Negligible Term" |

The significant terms are then digitized to yield the output of the second stage of the converter $$D_{n-m+1}(V_o) = \lfloor 2^n \cdot [V_i - Vdac_1(D_m(V_i))] \rfloor - 2^n \cdot \Delta Vdac_1(D_m(V_i)) + 2^{n-m+1} \cdot \Delta G_1 \cdot \{V_i - [Vdac_1(D_m(V_i))]\} \rfloor$$

which terms represent the ideal term, the DAC non-linearity, and the gain error, respectively.

The raw digitized error due to DAC non-linearity is given by $$CEdac_1 = \lfloor -2^n \cdot \Delta Vdac_1(D_m(V_i)) \rfloor$$

where $CEdac_1$ is the digitized code error

Therefore, to make this error less than one LSB without calibration:

$$|\Delta Vdac_1(D_m(V_i))| \ll \frac{1}{2^n}$$

Alternatively, the digitized code error $CEdac_1$ may be subtracted to digitally correct the DAC non-linearity error.

The digitized gain error is given by $$CE_{Gain\,1}(V_i) = \lfloor 2^{n-m+1} \cdot \Delta G_1 \cdot \{V_i - [Vdac_1(D_m(V_i))]\} \rfloor.$$

Figure 4:
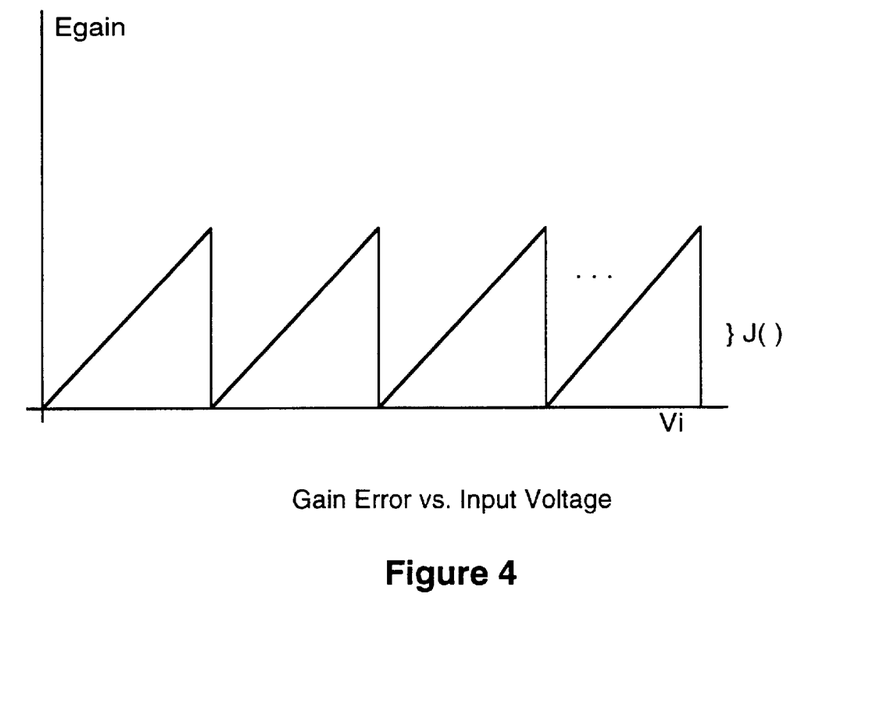
FIG. 4 is a graph showing the effects of gain error vs. input voltage.

The maximum voltage causing $CE_{Gain1}$ is defined as $J(\alpha)$ and occurs just before the MDAC makes a code transition, as illustrated in FIG. 4. This may cause a large DNL error when the first DAC transitions.

$$J(\alpha) = 2^{n-m+1} \cdot \Delta G_1 \cdot \frac{1}{2^m} = \frac{2^{n-m} \cdot \Delta G_1}{G_1}$$

where $\alpha = 0, 1, \ldots, 2^m - 1$.

Therefore, to avoid interstage gain calibration, the gain error must meet the following inequality:

$$\left|\frac{\Delta G_1}{G_1}\right| \ll 2^{n-m}$$

Now, the problem is to determine how to correct for this interstage gain error. The second stage is assumed to have ideal gain. If it did not, its gain error could simply be lumped into that of the first stage.

Assume that the input voltage is given by $$V_i = \frac{\alpha}{2^m}, \text{ where } 0 \le \alpha \le 2^m.$$

Now, $$E_{Gain1}(\alpha) =$$

$$2^{n-m+1} \cdot \Delta G_1 \cdot \frac{\alpha}{2^m} - DACTERM = 2^{n-m} \cdot \frac{\Delta G_1}{G_1} \cdot \alpha - DACTERM$$

Substituting for $J(\alpha)$ and digitizing gives $$CE_{Gain\,1}(\alpha) = \lfloor \alpha \cdot J(\alpha) \rfloor \text{ where } \alpha = 0, 1, \ldots, 2^m - 1$$

This term may subtracted digitally to correct for the interstage gain error. This process is called gain proration in the prior art because the gain error, $J(\alpha)$, which is constant, is prorated across the MDAC range by $\alpha$.

Effect of Digital Calibration on Gain Error

Digital calibration is performed by the n−m+1 stage to determine digital code error coefficients that will effectively undo the MDAC non-linearity. This is based on the assumption that the difference between two adjacent MDAC codes is ideally 0.5*VREF, and any difference from this ideal step is the incremental error. For the single-ended architecture discussed here, calibration begins at Δ=0 and the measured incremental errors are accumulated to determine the appropriate code error.

Let $V_{cal1}(\alpha)$ be the equivalent calibration voltage referred at Vo. Assume that there is no non-linearity error but that there is a gain error $\Delta G_1$. Since the reference voltage is normalized to one volt, each error measurement across MDAC code segments would ideally be a difference of 0.5. With a gain error, the measured error is given by $$V_{meas1}(j) = 0.5 \cdot \left(1 + \frac{\Delta G_1}{G}\right) - 0.5 = 0.5 \cdot \frac{\Delta G_1}{G_1}.$$

These are accumulated to give the equivalent calibration voltage of $$V_{Cal1}(\alpha) = \sum_{j=1}^{\alpha} V_{meas1}(j) = 0.5 \cdot \alpha \cdot \frac{\Delta G_1}{G_1}.$$

This is digitized by the second stage to give $$CV_{cal1}(\alpha) = \left\lfloor 2^{n-m+1} \cdot 0.5 \cdot \alpha \cdot \frac{\Delta G_1}{G_1} \right\rfloor = \left\lfloor 2^{n-m} \cdot \alpha \cdot \frac{\Delta G_1}{G_1} \right\rfloor = \lfloor \alpha \cdot J(\alpha) \rfloor$$

which is the desired gain correction shown above. This did not require any special gain proration correction in addition to the MDAC non-linearity code error correction. In the present invention, the gain error correction comes along for free.

Figure 5:
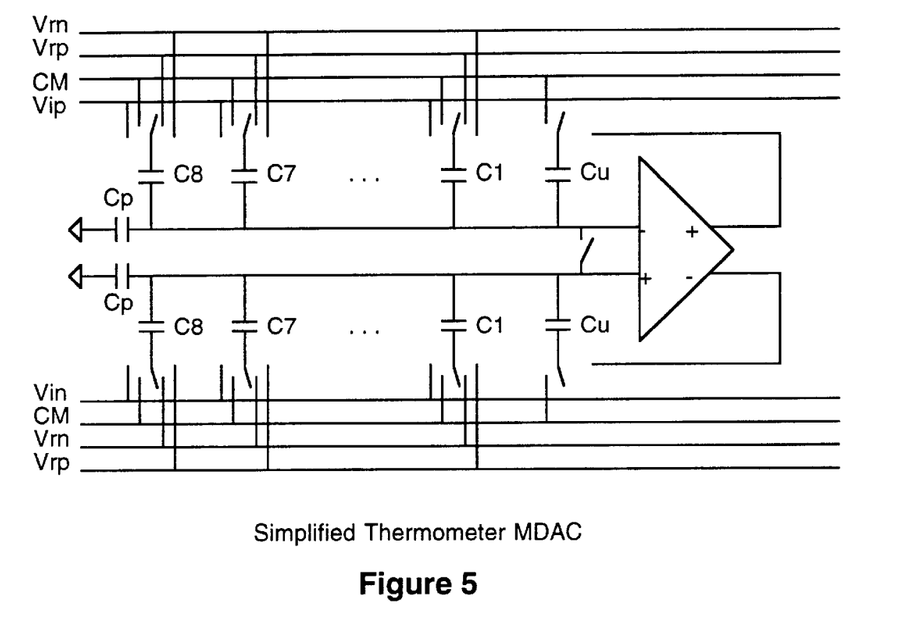
FIG. 5 is a diagram showing a thermometer multiplying analog-to-digital converter in simplified form.

FIG. 5 shows the 4-bit MDAC. A high-gain, high-bandwidth, fully differential operational amplifier is used. Note that $C_p$ is the parasitic capacitance at the input of the opamp, CM is the common-mode voltage, $V_{rp}$ and $V_{rn}$ are reference voltages, and $V_{ip}$ and $V_{in}$ are input voltages.

Initially, the input voltages are connected to the bottom plates of the capacitors, the feedback capacitors Cu are connected to the outputs of the opamp to store offsets (an auxiliary offset-cancellation loop may be used if desired), and the inputs of the opamp are shorted together (differential ground). The sample is taken by first releasing the shorting switch and then opening up the switches connected to the input voltages. At that point, the flash quantizer is strobed and the result drives the bottom-plate switches to CM, $V_{rp}$ or $V_{rn}$.

Then, the differential output voltage is given by $$V_{od} = \frac{\sum_{i=1}^{l} c_i \cdot \{V_{id} - (SGN)V_{ref}\} + \sum_{i=l+1}^{n} c_i \cdot (V_{id} - V_{cm}) + \left(\sum_{i=1}^{n} c_i + c_u + c_p\right) \cdot V_{os}}{c_u + \left(\sum_{i=1}^{n} c_i + c_u + c_p\right) \cdot \frac{1}{A}}$$

where SGN is the sign of the differential input voltage, $V_{os}$ is the offset of the opamp, A is the DC gain of the opamp, $V_{ref} = V_{rp} - V_{rn}$, and l is the number of comparators tripped (having outputs high).

Correction coefficients need to be generated for the first stage. Capacitor mismatches and interstage gain errors can be corrected taking an uncorrected converter of 10 or 11 bits resolution and correcting it to a 16 bit ADC.

Figure 6:
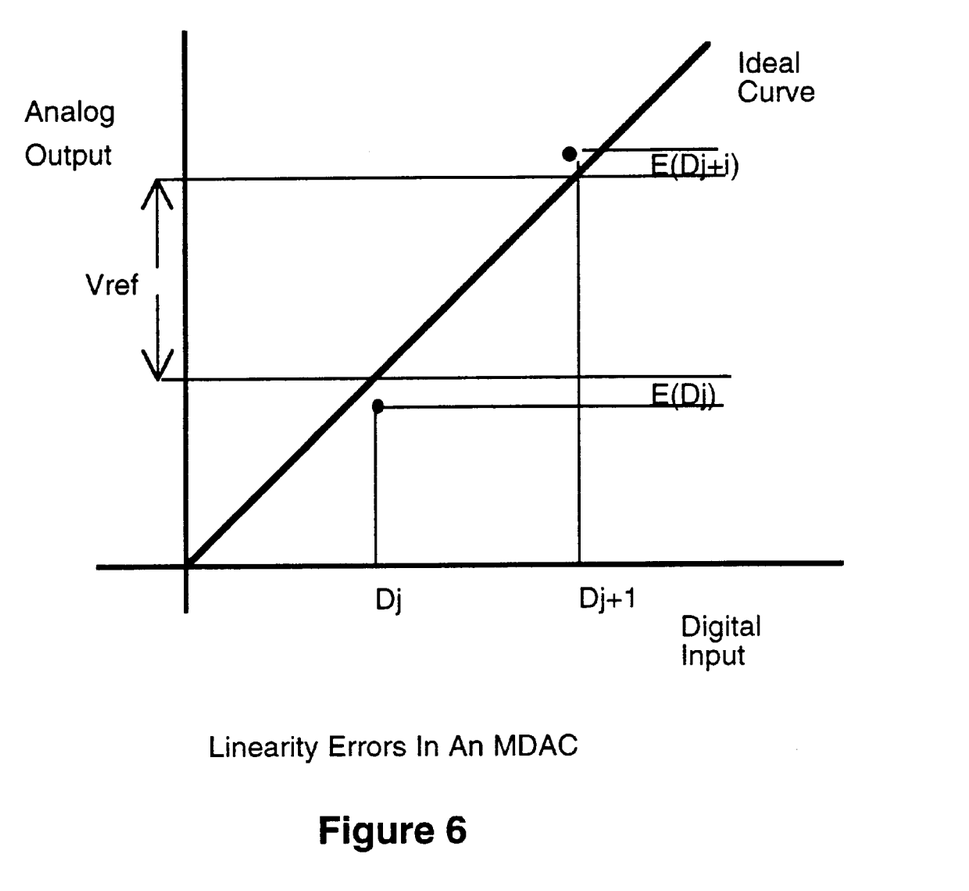
FIG. 6 is a graph illustrating linearity errors in a multiplying analog-to-digital converter.

FIG. 6 shows the basic principle behind the digital calibration of the MDAC. Between two adjacent codes, the output of the MDAC will ideally transition by Vref in the fully differential implementation. Essentially, one of the capacitor differential pairs is measured. Any deviation from this ideal step is an error. Once all of these errors are measured by the subsequent converter stages, a digital calibration signal is stored in a RAM during a foreground calibration cycle. During normal operation, these errors are digitally subtracted using digital hardware.

Figure 7:
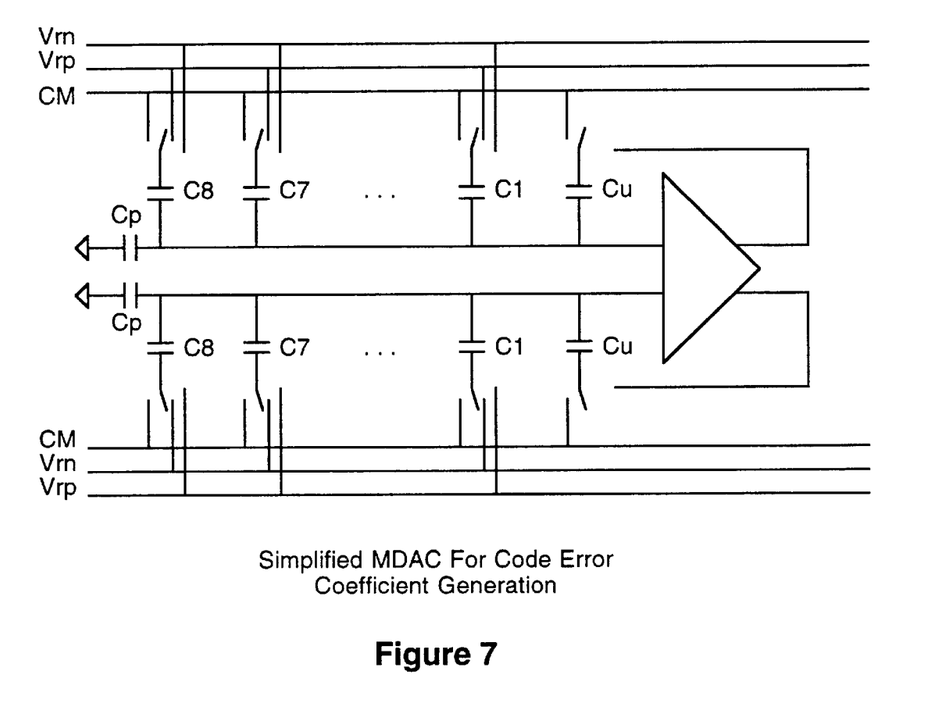
FIG. 7 is a diagram showing a simplified multiplying analog-to-digital converter for code error coefficient generation.

FIG. 7 shows the MDAC during a calibration cycle. Each segment error, $SE_i$, requires two measurements. First, the top feedback capacitor $C_u$ is connected to $V_{rp}$ and the bottom feedback capacitor is connected to $V_{rn}$. The input capacitors are initially in the state i−1. The feedback capacitors are then connected to the output of the opamp and a measurement is made by the subsequent ADC stages. At this point, the feedthrough of the feedback switches are measured as well as the offset of the opamp. Then, the input capacitors are switched to state i. The differential voltage at the output of the opamp is now given by $$V_{od} = \frac{c_i \cdot V_{ref} + \left(\sum_{j=1}^{n} c_j + c_u + c_p\right) \cdot V_{os} + V_{ft} \cdot c_u}{c_u} - V_{ref}$$

Now subtract the offset error and the feedthrough error. What is left is the sequence error, $$SE_i = \frac{c_i - c_u}{c_u} \cdot Vref$$

The sequence errors accumulate when moving either in the positive or the negative direction from the middle of the transfer curve. This error, defined as the code error, is given by $$CE_i = \sum_{j=1}^{i} SE_i$$

In normal operation, the code errors are subtracted digitally to linearize the MDAC's and to correct for interstage gain errors.

The foregoing calibration method begins at the center of the transfer curve rather than from one end or the other. By beginning in the center, calibrating in the positive direction and then calibrating in the negative direction, the interstage gain errors are also corrected without an extra gain-proration cycle. In addition, in comparison to he prior art method of Bang-Sup Song, the number of accumulated measurements is reduced by a factor of two for the final correction coefficients by using the preferred method. Therefore, the roundoff errors are also reduced. Further, if one takes advantage of the odd symmetry of the correction to eliminate the requirement of determining the code errors on both sides of zero, the number of accumulated measurements in comparison to the prior art method of Bang-Sup Song is reduced by a factor of almost 4 for the final correction coefficients.

The present invention method can be slightly modified to calibrate binary (vs. thermometer) MDAC's. It is possible that other MDAC architectures could also be calibrated using the techniques presented here with the same advantages over the prior art. Thus while the present invention has been disclosed and described with respect to a preferred embodiment thereof, it will be understood by those skilled in the art that the present invention may be varied without departing from the spirit and scope thereof.

What is claimed is:

1. A method of calibrating multistage analog-to-digital converters having gain errors between two successive stages and non-linearity errors in the first of the two successive stages of the converters comprising the steps of:

performing digital calibration on the second of the two successive stages beginning at the zero point of the analog-to-digital converter transfer curve to determine sequence errors of the second of the two successive stages in the positive and the negative directions; and, determining code errors of the second of the two successive stages as the accumulation of the sequence errors from the zero point of the analog-to-digital converter transfer curve to the respective code to provide respective code errors for digitally subtracting from the output of the multistage analog-to-digital converter.

2. The method of calibrating multistage analog-to-digital converters of claim 1 wherein the first of the two successive stages of the multistage analog-to-digital converters comprise a multiplying digital to analog converter.

3. The method of calibrating multistage analog-to-digital converters of claim 1 wherein the first of the two successive stages of the multistage analog-to-digital converters comprises a thermometer multiplying digital to analog converter.

4. The method of calibrating multistage analog-to-digital converters of claim 1 wherein the analog-to-digital converters comprise flash analog-to-digital converters with binary-weighted capacitor array multiplying digital-to-analog converters.

5. A method of calibrating multistage analog-to-digital converters having gain errors between two successive stages and non-linearity errors in the first of the two successive stages of the converters comprising the steps of:

performing digital calibration on the second of the two successive stages beginning at the zero point of the analog-to-digital converter transfer curve to determine sequence errors of the second of the two successive stages in one of the positive and the negative directions;

determining code errors of the second of the two successive stages as the accumulation of the sequence errors from the zero point of the analog-to-digital converter transfer curve to the respective code in the direction in which the sequence errors were determined to provide respective code errors for digitally subtracting from the output of the multistage analog-to-digital converter; and, determining code errors of the second of the two successive stages as the accumulation of the sequence errors from the zero point of the analog-to-digital converter transfer curve to the respective code in the direction opposite to that in which the sequence errors were determined using the complements of the corresponding sequence errors in the direction in which the sequence errors were determined to provide respective code errors for digitally subtracting from the output of the multistage analog-to-digital converter.

6. The method of calibrating multistage analog-to-digital converters of claim 5 wherein the first of the two successive stages of the multistage analog-to-digital converters comprise a multiplying digital to analog converter.

7. The method of calibrating multistage analog-to-digital converters of claim 5 wherein the first of the two successive stages of the multistage analog-to-digital converters comprises a thermometer multiplying digital to analog converter.

8. The method of calibrating multistage analog-to-digital converters of claim 5 wherein the analog-to-digital converters comprise flash analog-to-digital converters with binary-weighted capacitor array multiplying digital-to-analog converters.

* * * * *